(12) United States Patent
Zhao

(10) Patent No.: US 12,302,622 B2
(45) Date of Patent: May 13, 2025

(54) SEMICONDUCTOR DEVICE AND PREPARATION METHOD THEREOF

(71) Applicant: Dynax Semiconductor Inc., Suzhou (CN)

(72) Inventor: Shufeng Zhao, Suzhou (CN)

(73) Assignee: Dynax Semiconductor, Inc., Suzhou (CN)

( * ) Notice: Subject to any disclaimer, the term of this patent is extended or adjusted under 35 U.S.C. 154(b) by 562 days.

(21) Appl. No.: 17/588,732

(22) Filed: Jan. 31, 2022

(65) Prior Publication Data

US 2022/0165858 A1 May 26, 2022

Related U.S. Application Data

(63) Continuation of application No. PCT/CN2020/107819, filed on Aug. 7, 2020.

(30) Foreign Application Priority Data

Aug. 7, 2019 (CN) .......................... 201910726333.5

(51) Int. Cl.
| | |
|---|---|
| *H01L 29/423* | (2006.01) |
| *H01L 29/40* | (2006.01) |
| *H01L 29/417* | (2006.01) |
| *H01L 29/66* | (2006.01) |
| *H01L 29/778* | (2006.01) |
| *H10D 30/01* | (2025.01) |
| *H10D 30/47* | (2025.01) |
| *H10D 64/01* | (2025.01) |
| *H10D 64/23* | (2025.01) |

(Continued)

(52) U.S. Cl.
CPC .......... *H10D 64/411* (2025.01); *H10D 30/015* (2025.01); *H10D 30/475* (2025.01); *H10D 64/01* (2025.01); *H10D 64/258* (2025.01); *H01L 23/66* (2013.01)

(58) Field of Classification Search
CPC ............. H01L 29/42316; H01L 29/401; H01L 29/41775; H01L 29/66462; H01L 29/7786; H01L 23/66; H01L 29/2003; H01L 29/4236; H01L 29/0603; H01L 29/0684; H01L 29/66477
USPC ......................................................... 257/194
See application file for complete search history.

(56) References Cited

U.S. PATENT DOCUMENTS

| | | | | |
|---|---|---|---|---|
| 9,780,181 B1 * | 10/2017 | Teo | ..................... | H01L 29/2003 |
| 2014/0361310 A1 * | 12/2014 | Yu | ....................... | H01L 29/2003 257/194 |
| 2018/0151681 A1 * | 5/2018 | Lavanga | ............... | H01L 29/205 |

* cited by examiner

*Primary Examiner* — Tong-Ho Kim
(74) *Attorney, Agent, or Firm* — Westbridge IP LLC

(57) ABSTRACT

Disclosed are a semiconductor device and a preparation method thereof. The semiconductor device includes a substrate, a multilayer semiconductor layer, a dielectric layer, a source and a drain. A gate trench is formed in the multilayer semiconductor layer and the dielectric layer. A gate is formed in the gate trench, and the gate trench includes a first sub-portion of the gate trench formed in the multilayer semiconductor layer and a second sub-portion of the gate trench penetrating the dielectric layer. The second sub-portion of the gate trench includes a second opening located on the surface of the dielectric layer close to the substrate and a third opening on the surface of the dielectric layer away from the substrate. The vertical projection of the third opening on the substrate covers the vertical projection of the second opening on the substrate.

20 Claims, 6 Drawing Sheets

(51) Int. Cl.
*H10D 64/27* (2025.01)
*H01L 23/66* (2006.01)

SEMICONDUCTOR DEVICE AND PREPARATION METHOD THEREOF

CROSS-REFERENCE TO RELATED APPLICATIONS

This application is a continuation of International Application No. PCT/CN2020/107819 filed on Aug. 7, 2020, which claims priority to Chinese Patent Application No. 201910726333.5 filed on Aug. 7, 2019, the entire contents of which are incorporated herein by reference.

TECHNICAL FIELD

The embodiments of this application relate to the field of semiconductor technology, and in particular to a semiconductor device and a preparation method thereof.

BACKGROUND

Due to the advantages of high output power and high operating frequency, GaN semiconductor devices are very suitable for application scenarios requiring high frequency and high power. Therefore, the research of GaN high-frequency devices is increasingly recognized by the industry and has gradually become one of the hotspots in the research of high-frequency semiconductor devices.

In recent years, in terms of the application of GaN microwave devices, especially the rapid development of 5G technology, the research of high-frequency and high-power devices is urgently needed to be strengthened. Therefore, the realization of GaN high-frequency device technology is of great significance.

The gate length process window design is closely related to the frequency characteristics of semiconductor devices and is one of the important process parameters for realizing high-frequency devices. The smaller the gate length, the higher the operating frequency of the device. However, there are many technical bottlenecks in how to achieve a high-quality small gate length process. For example, a small gate length will increase the gate resistance. Although a T-type gate or a gate cap gate structure can reduce the gate resistance, the introduction of the gate field plate will increase the parasitic capacitance. There are also a series of technical problems such as deformation of fine gate metal strips being easily caused by the gate process for small line widths during metal stripping.

Therefore, a fine gate process which can achieve low parasitic resistance, low parasitic capacitance, and good quality is urgently needed at present.

SUMMARY

In view of this, the embodiments of this application provide a semiconductor device and a preparation method thereof, which solves the technical problems of low parasitic resistance, low parasitic capacitance and reliable quality that the existing fine gate process of semiconductor devices cannot take care of all together. This is beneficial to improve the application of high frequency characteristics of semiconductor devices in the field of radio frequency and microwave.

In an aspect, the embodiments of this application provide a semiconductor device, comprising:

a substrate;

a multi-layer semiconductor layer located on a side of the substrate, a first sub-portion of a gate trench being formed on a side of the multi-layer semiconductor layer away from the substrate, the first sub-portion of the gate trench comprising a bottom surface located inside the multilayer semiconductor layer and a first opening located on a surface of the multilayer semiconductor layer, and a vertical projection of the first opening on the substrate covering a vertical projection of the bottom surface on the substrate;

a dielectric layer located on the side of the multi-layer semiconductor layer away from the substrate, a second sub-portion of the gate trench penetrating the dielectric layer being formed in the dielectric layer, and the first sub-portion of the gate trench and the second sub-portion of the gate trench forming the gate trench; the second sub-portion of the gate trench comprising a second opening located on a surface of the dielectric layer close to the substrate and a third opening located on a surface of the dielectric layer away from the substrate, a vertical projection of the third opening on the substrate covering a vertical projection of the second opening on the substrate, and an opening area of the third opening is greater than an opening area of the second opening;

a gate located in the gate trench, and a source and a drain located on the side of the multilayer semiconductor layer away from the substrate, the gate being located between the source and the drain, wherein the vertical projection of the second opening on the substrate coincides with the vertical projection of the first opening on the substrate, the second sub-portion of the gate trench further comprises a first sidewall connecting the second opening and the third opening, the first sub-portion of the gate trench further comprises a second sidewall connecting the bottom surface and the first opening; and a cross-sectional shape of the first sidewall in a direction perpendicular to a plane where the second opening is located is a curve or a straight line, and a tangent line at any point on the curve is located on a side where the first sidewall faces a center of the second sub-portion of the gate trench.

In some embodiments of this application, an extension length of the bottom surface along a direction from the source to the drain is denoted as L3, L3≤0.25 μm.

In some embodiments of this application, a vertical projection length of the first sidewall on the substrate along a direction from the source to the drain is denoted as L1, and an extension length of the first sidewall along a direction perpendicular to the substrate is denoted as L2, L1<L2.

In some embodiments of this application, an extension length of the first sidewall along a direction perpendicular to the substrate is denoted as L2, and an extension length of the second sidewall along the direction perpendicular to the substrate is denoted as L4, L4≤L2.

In some embodiments of this application, an extension length of the second sidewall along a direction perpendicular to the substrate is denoted as L4, L4≤15 nm.

In some embodiments of this application, a vertical projection length of the first sidewall on the substrate along a direction from the source to the drain is denoted as L1, a vertical projection length of the second sidewall on the substrate along the direction from the source to the drain is denoted as L5, an extension length of the first sidewall along a direction perpendicular to the substrate is denoted as L2, and an extension length of the second sidewall along the direction perpendicular to the substrate is denoted as L4, L2/L1 ≤L4/L5.

In some embodiments of this application, the cross-sectional shape of the second sidewall in the direction perpendicular to the plane where the first opening is located is a straight line, a tangent line of the first sidewall at a joining position of the first sidewall and the second sidewall coincides with the second sidewall.

In some embodiments of this application, wherein a cross-sectional shape of the second sidewall in the direction perpendicular to the plane where the first opening is located is a curve, the tangent line of the first sidewall at the joining position of the first sidewall and the second sidewall coincides with a tangent line of the second sidewall at the joining position of the first sidewall and the second sidewall.

In some embodiments of this application, an extension length of the bottom surface along a direction from the source to the drain is denoted as L3, and a size of the first opening along the direction from the source to the drain is denoted as L6, $L3 \leqslant L6 \leqslant 0.4$ μm.

In some embodiments of this application, a two-dimensional electron gas is formed in the multilayer semiconductor layer; and a distance between the bottom surface and a surface of the two-dimensional electron gas along a direction perpendicular to the substrate is denoted as h, $h \geqslant 15$ nm.

In some embodiments of this application, a surface of the gate away from the substrate fits an edge of the third opening of the second sub-portion of the gate trench.

In another aspect, the embodiments of this application provide a preparation method for a semiconductor device, comprising:

preparing a multilayer semiconducting layer on a side of a substrate;
  preparing a first sub-portion of a gate trench on a side of the multilayer semiconductor layer away from the substrate, the first sub-portion of the gate trench comprising a bottom surface located inside the multilayer semiconductor layer and a first opening located on a surface of the multilayer semiconductor layer, a vertical projection of the first opening on the substrate covering a vertical projection of the bottom surface on the substrate;
  preparing a dielectric layer on the side of the multi-layer semiconductor layer away from the substrate;
  preparing a second sub-portion of the gate trench penetrating the dielectric layer, the first sub-portion of the gate trench and the second sub-portion of the gate trench forming the gate trench, the second sub-portion the gate trench comprising a second opening located on a surface of the dielectric layer close to the substrate and a third opening located on a surface of the dielectric layer away from the substrate, a vertical projection of the third opening on the substrate covering a vertical projection of the second opening on the substrate, and an opening area of the third opening is greater than an opening area of the second opening; and
  preparing a gate in the gate trench and a source and a drain on the side of the multilayer semiconductor layer away from the substrate, and the gate being located between the source and the drain, wherein
  the vertical projection of the second opening on the substrate coincides with the vertical projection of the first opening on the substrate, the second sub-portion of the gate trench further comprises a first sidewall connecting the second opening and the third opening, the first sub-portion of the gate trench further comprises a second sidewall connecting the bottom surface and the first opening; and
  a cross-sectional shape of the first sidewall in a direction perpendicular to a plane where the second opening is located is a curve or a straight line, and a tangent line at any point on the curve is located on a side where the first sidewall faces a center of the second sub-portion of the gate trench.

In some embodiments of this application, the preparing the first sub-portion of the gate trench on the side of the multilayer semiconductor layer away from the substrate comprises: preparing the first sub-portion of the gate trench at a designated position on the side of the multi-layer semiconductor layer away from the substrate using a first mask process.

In some embodiments of this application, the preparing the dielectric layer on the side of the multilayer semiconductor layer away from the substrate comprises: preparing the dielectric layer on the surface of the multilayer semiconductor layer away from the substrate and in the first sub-portion of the gate trench. The preparing the second sub-portion of the gate trench penetrating the dielectric layer comprises: removing a part of the dielectric layer above the first sub-portion of the gate trench and a part of the dielectric layer inside the first sub-portion of the gate trench using a second mask process; and removing a part of the dielectric layer surrounding the first sub-portion of the gate trench using a gradual process of gradually decreasing an etch rate aspect ratio of the dielectric layer by using a third mask process, so as to obtain the second sub-portion of the gate trench.

In the semiconductor device and the preparation method thereof according to the embodiments of this application, the first sub-portion of the gate trench is provided in the multilayer semiconductor layer and the second sub-portion of the gate trench is provided in the dielectric layer, the vertical projection of the first opening of the first sub-portion of the gate trench on the substrate covers the vertical projection of the bottom surface of the first sub-portion of the gate trench on the substrate, the vertical projection of the third opening of the second sub-portion of the gate trench on the substrate covers the vertical projection of the second opening of the second sub-portion of the gate trench on the substrate, and the opening area of the third opening is greater than that of the second opening. In this way, on one hand, it can ensure that the gate trench has a smaller size on the side close to the substrate, which is beneficial to realize the high-frequency characteristics of the semiconductor device; on the other hand, it can ensure that the gate trench has a relatively larger size on the side far from the substrate, which is beneficial to reduce the gate resistance and enhance the control ability of the gate of the semiconductor device to the channel region, so that the short channel effect of the semiconductor device can be suppressed and the reliability of the device can be improved. In another aspect, due to the opening area of the third opening being greater than that of the second opening, the deformation of the gate metal strip can be prevented when the gate metal on the surface of the dielectric layer is stripped, thereby improving the accuracy of preparation process for the small-sized gate.

BRIEF DESCRIPTION OF DRAWINGS

In order to describe the technical solutions of the exemplary embodiments of this application more clearly, the following briefly introduces the drawings required to describe the embodiments. Apparently, the drawings described are only a part of the drawings of the embodiments to be described in this application, rather than all the drawings. Those ordinary skill in the art can also get other drawings based on these attachments without creative work.

DETAILED DESCRIPTION OF THE EMBODIMENTS

In order to make the objectives, technical solutions, and advantages of this application clearer, the technical solutions of this application will be fully described below through specific embodiments with reference to the accompanying drawings in the embodiments of this application. Apparently, the described embodiments are part of the embodiments of this application, but not all of them. Based on the embodiments of this application, all other embodiments obtained by those of ordinary skill in the art without creative work fall within the protection scope of this application.

Figure 1:
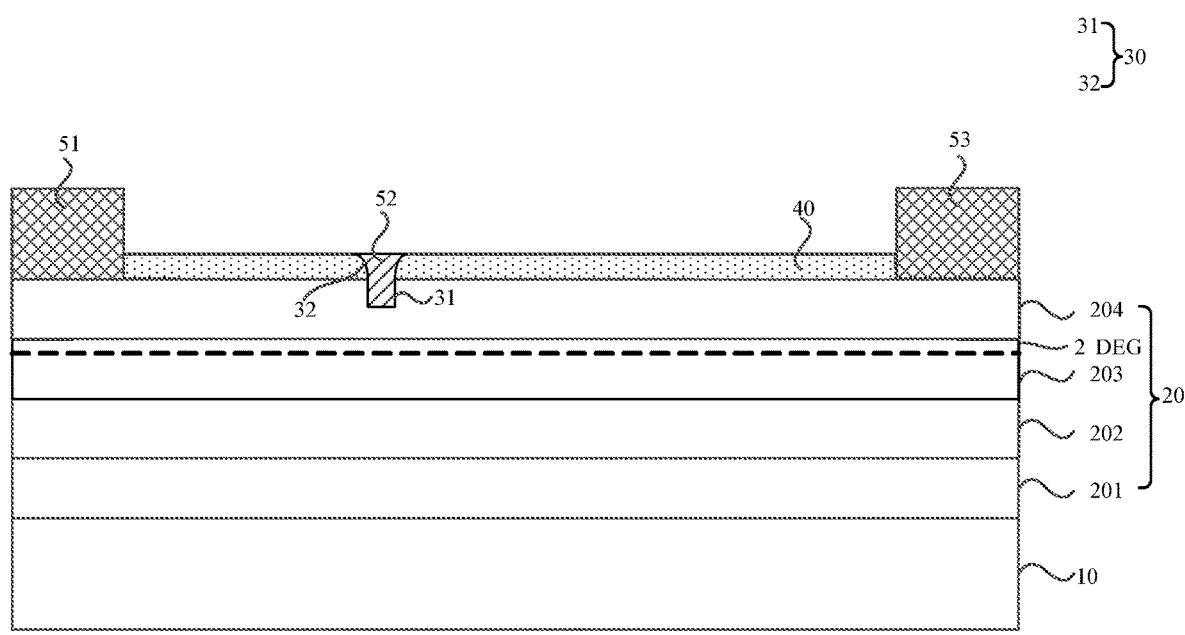
FIG. 1 is a schematic structural diagram of a semiconductor device according to an embodiment of this application.
Figure 2:
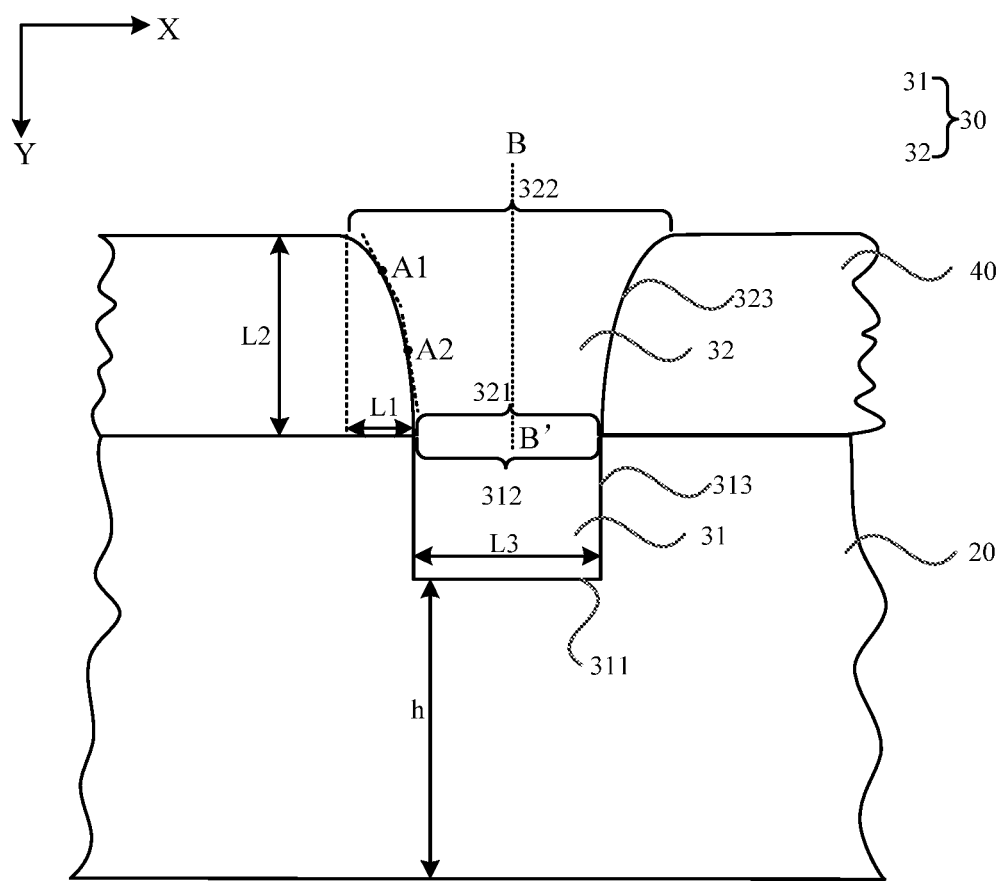
FIG. 2 is a schematic enlarged diagram of a gate trench according to the embodiment of this application.

FIG. 1 is a schematic structural diagram of a semiconductor device according to an embodiment of this application, and FIG. 2 is a schematic enlarged diagram of a gate trench according to the embodiment of this application, specifically a schematic enlarged diagram of a gate trench portion in FIG. 1. As shown in FIG. 1 and FIG. 2, the semiconductor device according to the embodiment of this application may include: a substrate 10, a multilayer semiconductor layer 20, a dielectric layer 40, a gate 52, a source 51 and a drain 53.

The multilayer semiconductor layer 20 is located on one side of the substrate 10. A first sub-portion 31 of the gate trench 30 is formed on a side of the multilayer semiconductor layer 20 away from the substrate 10. The first sub-portion 31 of the gate trench 30 includes a bottom surface 311 located inside the multilayer semiconductor layer 20 and a first opening 312 located on a surface of the multilayer semiconductor layer 20. A vertical projection of the first opening 312 on the substrate 10 covers a vertical projection of the bottom surface 311 on the substrate 10.

The dielectric layer 40 is located on the side of the multilayer semiconductor layer 20 away from the substrate 10. The dielectric layer 40 is formed with a second sub-portion 32 of the gate trench 30 penetrating the dielectric layer 40. The first sub-portion 31 of the gate trench 30 and the second sub-portion 32 of the gate trench 30 form the gate trench 30. The second sub-portion 32 of the gate trench 30 includes a second opening 321 located on a surface of the dielectric layer 40 close to the substrate 10 and a third opening 322 located on a surface of the dielectric layer 40 away from the substrate 10. A vertical projection of the third opening 322 on the substrate 10 covers a vertical projection of the second opening 321 on the substrate 10, and an opening area of the third opening 322 is greater than that of the second opening 321.

The gate 52 is located in the gate trench 30, the source 51 and the drain 52 are located on the side of the multilayer semiconductor layer 20 away from the substrate 10, and the gate 52 is located between the source 51 and the drain 53.

Exemplarily, the gate trench 30 includes the first sub-portion 31 of the gate trench 30 located in the multilayer semiconductor layer 20 and the second sub-portion 32 of the gate trench 30 penetrating the dielectric layer 40. The first sub-portion 31 of the gate trench 30 includes a bottom surface 311 located inside the multilayer semiconductor layer 20 and a first opening 312 located on the surface of the multilayer semiconductor layer 20. The second sub-portion 32 of the gate trench 30 includes a second opening 321 located on the surface of the dielectric layer 40 close to the substrate 10 and a third opening 322 located on the surface of the dielectric layer 40 away from the substrate 10. Further, the vertical projection of the first opening 312 on the substrate 10 covers the vertical projection of the bottom surface 311 on the substrate 10, the vertical projection of the third opening 322 on the substrate 10 covers the vertical projection of the second opening 321 on the substrate 10, and the opening area of the third opening 322 is greater than that of the second opening 321, so that the gate trench 30 has a smaller size on the side close to the substrate 10, and thus the gate 52 formed in the gate trench 30 has a smaller size on the side close to the substrate 10. Since the size of the gate 52 is closely related to the frequency characteristics of the semiconductor device, that is, the smaller the size of the gate 52, the higher the operating frequency of the semiconductor device. Therefore, the gate 52 having a smaller size on the side close to the substrate 10 can ensure that the semiconductor device has a higher operating frequency, which is beneficial to realize the high frequency characteristics of the semiconductor device. Further, the side of the gate trench 30 away from the substrate 10 has a larger size, so the gate 52 formed in the gate trench 30 has a larger size on the side away from the substrate 10, which is beneficial to reduce the size and enhance the ability of the gate of the semiconductor device to control the channel region, so that the short channel effect of the semiconductor device can be suppressed and the reliability of the device can be improved.

In addition, since the gate 52 is obtained by depositing gate metal on the upper surface of the dielectric layer 40 and in the gate trench 30, the gate metal on the surface of the dielectric layer 40 needs to be stripped after the gate 52 is prepared in the gate trench 30. By providing the gate trench 30 with a larger opening area on one side of the dielectric layer 40, the deformation of the gate metal strip can be prevented when the gate metal on the surface of the dielectric layer 40 is stripped, thereby improving the accuracy of preparation process for the small-sized gate.

Preferably, when the gate metal on the surface of the dielectric layer 40 is stripped to form the gate 52, the gate 52 is completely embedded in the first sub-portion 31 of the gate trench 30 and the second sub-portion 32 of the gate trench 30, that is, the surface of the gate 52 away from the substrate 10 fits the edge of the third opening of the second sub-portion 32 of the gate trench 30, thereby reducing the pulling or separation of the edge of the small-sized gate and ensuring the stability of the small-sized gate structure.

In an embodiment, the material of the substrate 10 may be Si, SiC or sapphire. The multi-layer semiconductor layer 20 is located on one side of the substrate 10, and the multi-layer semiconductor layer 20 may specifically be a III-V compound semiconductor material, or silicon or other semiconductor materials, which is not limited in the embodiments of this application.

In an embodiment, the source 51 and the drain 53 form ohmic contacts with the multilayer semiconductor layer 20, and the gate 52 forms Schottky contact with the multilayer semiconductor layer 20. Optionally, the material of the source 51 and the drain 53 may be one or a combination of metals such as Ni, Ti, Al and Au, and the material of the gate 52 may be one or a combination of metals such as Ni, Pt, Pb and Au.

In the semiconductor device according to the embodiments of this application, the first sub-portion of the gate trench is provided in the multilayer semiconductor layer and the second sub-portion of the gate trench is provided in the dielectric layer, the vertical projection of the first opening of the first sub-portion of the gate trench on the substrate covers the vertical projection of the bottom surface of the first sub-portion of the gate trench on the substrate, the vertical projection of the third opening of the second sub-portion of the gate trench on the substrate covers the vertical projection of the second opening of the second sub-portion of the gate trench on the substrate, and the opening area of the third opening is greater than that of the second opening. In this way, on one hand, it can ensure that the gate trench has a smaller size on the side close to the substrate, which is beneficial to realize the high-frequency characteristics of the semiconductor device; on the other hand, it can ensure that the gate trench has a relatively larger size on the side far from the substrate, which is beneficial to reduce the gate resistance and enhance the control ability of the gate of the semiconductor device to the channel region, so that the short channel effect of the semiconductor device can be suppressed and the reliability of the device can be improved. In another aspect, due to the opening area of the third opening being greater than that of the second opening, the deformation of the gate metal strip can be prevented when the gate metal on the surface of the dielectric layer is stripped, thereby improving the accuracy of preparation process for the small-sized gate.

According to an embodiment of this application, the vertical projection of the second opening 321 on the substrate 10 coincides with the vertical projection of the first opening 312 on the substrate 10, so as to ensure that the first sub-portion 31 of the gate trench 30 completely fits the second sub-portion 32 of the gate trench 30, which prevents the gate from being deformed during the gate metal stripping procedure and improves the stability and reliability of the semiconductor device.

Specifically, the vertical projection of the third opening 322 on the substrate 10 covers the vertical projection of the second opening 321 on the substrate 10, and the opening area of the third opening 322 is greater than that of the second opening 321, thus ensuring that the coverage area 51 of the bottom surface 311, the opening area S2 of the first opening 312, the opening area S3 of the second opening 321, and the opening area S4 of the third opening 322 satisfy S1≤S2=S3<S4.

According to an embodiment of this application, with continued reference to FIG. 2, the second sub-portion 32 of the gate trench 30 further includes a first sidewall 323 connecting the second opening 321 and the third opening 322, and the cross-sectional shape of the first sidewall 323 in the direction perpendicular to the plane of the second opening 321 may be a curve.

In an embodiment, the tangent line at any point on the curve is located on a side of the first sidewall 323 facing the center (such as the center line B-B') of the second sub-portion 32 of the gate trench 30.

Exemplarily, as shown in FIG. 2, taking the tangent lines at two points A1 and A2 being located on one side where the first sidewall 323 faces the center line B-B' of the second sub-portion 32 of the gate trench 30 as an example, the cross-sectional shape of the first sidewall 323 connecting the second opening 321 and the third opening 322 in the direction perpendicular to the plane of the second opening 321 is provided as a smooth curve, and the tangent line to any point on the smooth curve is located on the side of the first sidewall 323 facing the center line B-B' of the second sub-portion 32 of the gate trench 30, that is, the first sidewall 323 protrudes toward the second sub-portion 32 of the gate trench 30, which can ensure that the second sub-portion 32 of the gate trench 30 has a larger opening only on the side away from the substrate 10. That is, only the third opening 322 has a larger opening area, and the opening area of the part of the gate trench 30 under the third opening 322 is smaller. This not only ensures that the semiconductor device has a higher operating frequency and a smaller gate resistance, a stronger ability and reliability of the gate control channel, but also ensures the parasitic capacitance between the gate 52 formed in the gate trench 30 and the two-dimensional electron gas (2DEG) formed under it is small, reducing the impact on the electrical performance of the semiconductor device.

Further, the cross-sectional shape of the first sidewall 323 may include a circular arc; or the cross-sectional shape of the first sidewall 323 is obtained by smoothly connecting a plurality of circular arcs with different curvature radii in sequence. If the cross-sectional shape of the first sidewall 323 is a circular arc, the circle center corresponding to the first sidewall 323 on the side close to the drain 53 is located between the second sub-portion 32 of the gate trench 30 and the drain 53 and the circle center corresponding to the first sidewall 323 on one side close to the source 51 is located between the second sub-portion 32 of the gate trench 30 and the source 51. If the cross-sectional shape of the first sidewall 323 is obtained by smoothly connecting a plurality of arcs with different curvature radii, a plurality of circle centers corresponding to the first sidewalls 323 on the side close to the drain 53 are all located between the second sub-portion 32 of the gate trench 30 and the drain 53, a plurality of circle centers corresponding to the first sidewall 323 on the side close to the source 51 are located between the second sub-portion 32 of the gate trench 30 and the source 51. In this way, it can be ensured that the second sub-portion 32 of the gate trench 30 only has a larger opening on the side away from the substrate 10, that is, only the third opening 322 has a larger opening area, and the opening area of the gate trench 30 under the third opening 322 is usually small, which can ensure that the parasitic capacitance between the gate 52 formed in the gate trench 30 and the two-dimensional electron gas under it is small, and the impact on the electrical performance of the semiconductor device is reduced.

Figure 3:
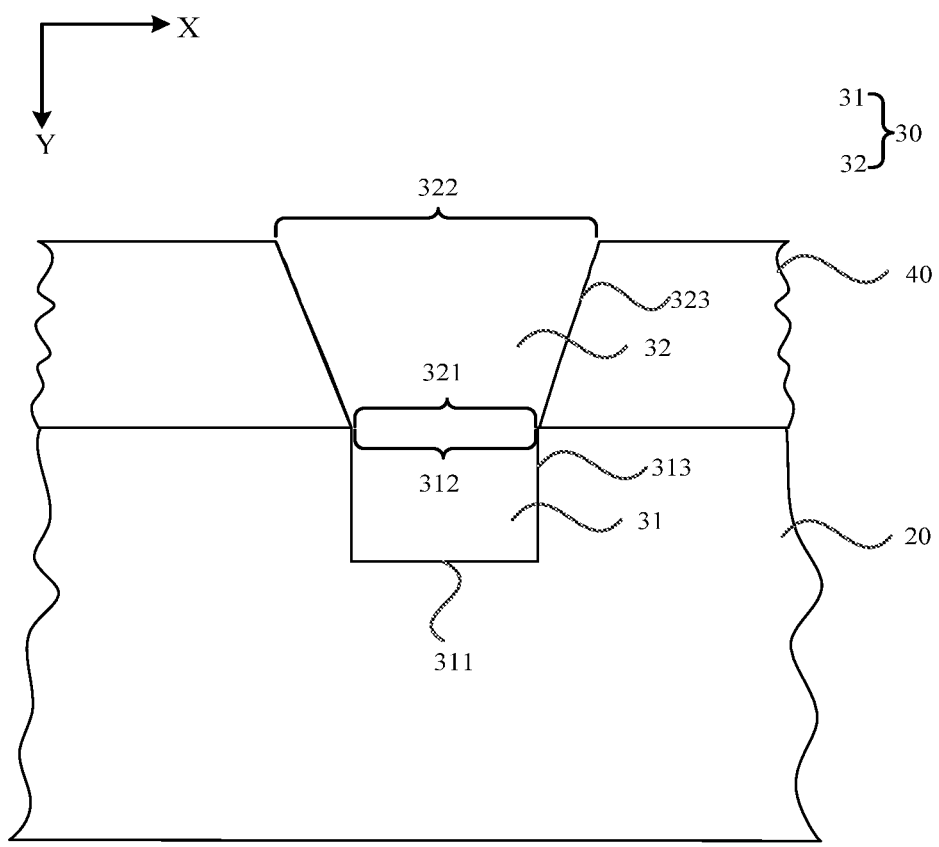
FIG. 3 is a schematic enlarged diagram of a gate trench according to another embodiment of this application.

It should be noted that in the embodiments of this application, the cross-sectional shape of the first sidewall 323 is a smooth curve, and the tangent line at any point on the smooth curve includes the part located in the second sub-portion of the gate trench. It can be understood that the cross-sectional shape of the first sidewall 323 may also be a straight line, for example, the cross-sectional shape of the second sub-portion 32 of the gate trench 30 is an inverted trapezoid, as shown in FIG. 3. In this way, it can also be ensured that the semiconductor device has both high frequency characteristics, small gate resistance, and great stability.

In other embodiments of this application, the cross-sectional shape of the first sidewall 323 may be a combination of a straight line and a curve. Preferably, there is a smooth transition between the curve and the straight line (without convex or concave points) to avoid the phenomenon of charge accumulation. The curve may protrude toward the second sub-portion 32 of the gate trench 30 or protrude toward the dielectric layer 40. Optionally, a part of the curve may protrude toward the second sub-portion 32 of the gate trench 30, and another part protrudes toward the dielectric layer 40, as long as the curve is a smooth curve and there is a smooth transition between the curve and the straight line.

Of course, in other embodiments, there may be a non-smooth transition between the curve and the straight line.

Continuing to refer to FIG. 2, along the direction from the source 51 to the drain 53, as the X direction as shown in FIG. 2, the vertical projection length of the first sidewall 323 on the substrate 10 is denoted as L1, and the extension length of the first sidewall 323 along the direction perpendicular to the substrate 10 is denoted as L2.

According to an embodiment of this application, L1<L2.

Exemplarily, the vertical projection length L1 of the first sidewall 323 on the substrate 10 and the extension length L2 of the first sidewall 323 along the direction perpendicular to the substrate 10 are set to satisfy L1<L2, so that the area of the third opening 322 beyond the second opening 321 will not be too large, ensuring small parasitic capacitance between the gate 52 on the side of the third opening 322 and the two-dimensional electron gas under it, and good electrical performance of the semiconductor device.

According to an embodiment of this application, continuing to refer to FIG. 2, along the direction from the source 51 to the drain 53, i.e., the X direction as shown in FIG. 2, the extension length of the bottom surface 311 is denoted as L3, where $L3 \leqslant 0.25$ μm.

Exemplarily, the extension length of the bottom surface 311 is the extension length of the gate 52 on the side close to the substrate 10, and the extension length L3 of the bottom surface 311 is set to satisfy $L3 \leqslant 0.25$ μm, which is beneficial to realize the high frequency characteristics of the semiconductor device. Preferably, when the extension length L3 of the bottom surface 311 satisfies $L3 \leqslant 0.2$ μm, the extension length of the gate 52 close to the substrate 10 can be ensured to be small, and the high frequency characteristics of the semiconductor device can be fully utilized.

According to an embodiment of this application, with continued reference to FIGS. 1 and 2, the bottom surface 311 is parallel to the surface of the two-dimensional electron gas in the multilayer semiconductor layer 20. Along the direction perpendicular to the substrate 10, i.e., the Y direction as shown in FIG. 2, the distance between the bottom surface 311 and the surface of the two-dimensional electron gas is denoted as h, where $h \geqslant 15$ nm.

Exemplarily, the gate 52 extends through the dielectric layer 40 to the inside of the semiconductor layer 20, and the distance h between the bottom surface 311 of the gate 52 and the surface of the two-dimensional electron gas satisfies $h \geqslant 15$ nm, which can ensure when the channel of the semiconductor device is in the on-state and the semiconductor device obtains high-frequency characteristics, the low on-resistance characteristics of the semiconductor device are ensured due to the sufficient two-dimensional electron gas under the gate trench 30.

Figure 4:
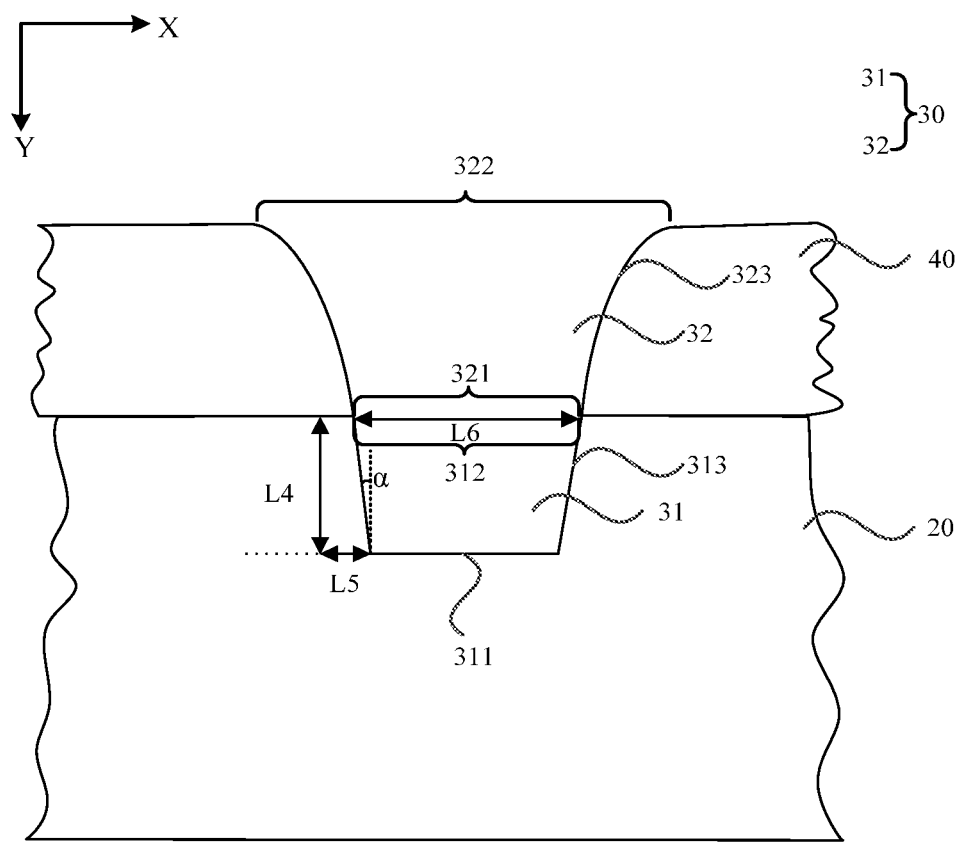
FIG. 4 is a schematic enlarged diagram of a gate trench according to still another embodiment of this application.

FIG. 4 is a schematic enlarged diagram of a gate trench according to still another embodiment of this application. Referring to FIG. 2 to FIG. 4, the first sub-portion 31 of the gate trench 30 further includes a second sidewall 313 connecting the bottom surface 311 and the first opening 312, and the cross-sectional shape of the second sidewall 313 in the direction perpendicular to the plane where the first opening 312 is located is a straight line, and the angle between the second sidewall 313 and the direction perpendicular to the substrate 10 is denoted as α, where $0° \leqslant \alpha \leqslant 45°$.

Exemplarily, the vertical projection of the first opening 312 on the substrate 10 covers the vertical projection of the bottom surface 311 on the substrate 10. For example, the opening area of the first opening 312 is equal to the coverage area of the bottom surface 311, as shown in FIGS. 2 and 3; alternatively, the opening area of the first opening 312 is greater than the coverage area of the bottom surface 311, as shown in FIG. 4. If the opening area of the first opening 312 is equal to the coverage area of the bottom surface 311, the angle α between the second sidewall 313 and the direction perpendicular to the substrate 10 (the Y direction as shown in the figures) is equal to 0°. If the opening area of the first opening 312 is greater than the coverage area of the bottom surface 311, the angle α between the second sidewall 313 and the direction perpendicular to the substrate 10 (the Y direction as shown in the figures) is greater than 0°.

It should be noted that, in other embodiments, the angle α between the second sidewall 313 and the direction perpendicular to the substrate 10 (the Y direction as shown in the figures) also needs to satisfy $\alpha \leqslant 45°$, so as to avoid the parasitic capacitance between the gate 52 and the two-dimensional electron gas under it being too large because of the over large first opening 312, which affects the electrical performance of the semiconductor device.

In other embodiments, the cross-sectional shape of the second sidewall 313 in the direction perpendicular to the plane where the first opening 312 is located is a curve. Optionally, the cross-sectional shape of the second sidewall 313 in the direction perpendicular to the plane where the first opening 312 is located is a combination of a curve and a straight line, and the curve and the straight line can be smoothly transitioned.

The extension length of the second sidewall 313 along the direction perpendicular to the substrate 10 is denoted as L4.

According to an embodiment of this application, $L4 \leqslant L2$, which can maintain the stability of the entire gate structure.

According to an embodiment of this application, $L4 \leqslant 15$ nm, which can effectively reduce parasitic capacitance.

According to an embodiment of this application, along the direction from the source 51 to the drain 53, the vertical projection length of the second sidewall 313 on the substrate 10 is denoted as L5, and the ratio of L2 to L1 is less than or equal to the ratio of L4 to L5, that is, $L2/L1 \leqslant L4/L5$. In this way, the first sub-portion 31 of the gate trench 30 can have a smaller size and the second sub-portion 32 of the gate trench 30 can have a larger size, thereby effectively reducing the gate resistance and improving the reliability of the device.

According to an embodiment of this application, along the direction from the source 51 to the drain 53, the size of the first opening 312 is denoted as L6, $L3 \leqslant L6 \leqslant 0.4$ μm, which can effectively increase the operating frequency of the device and reduce the gate resistance.

In an embodiment, if the cross-sectional shape of the first sidewall 323 in the direction perpendicular to the plane where the second opening is located is a straight line, the angle between the straight line and the direction perpendicular to the substrate 10 is denoted as β, and β is greater than or equal to the angle α between the second sidewall 313 and the direction perpendicular to the substrate 10. If the cross-sectional shape of the first sidewall 323 in the direction perpendicular to the plane where the second opening is located is a curve, the angle between the tangent line at any point on the curve and the direction perpendicular to the substrate 10 is denoted as β', and β' is greater than or equal to the angle α between the second sidewall 313 and the direction perpendicular to the substrate 10.

Figure 5:
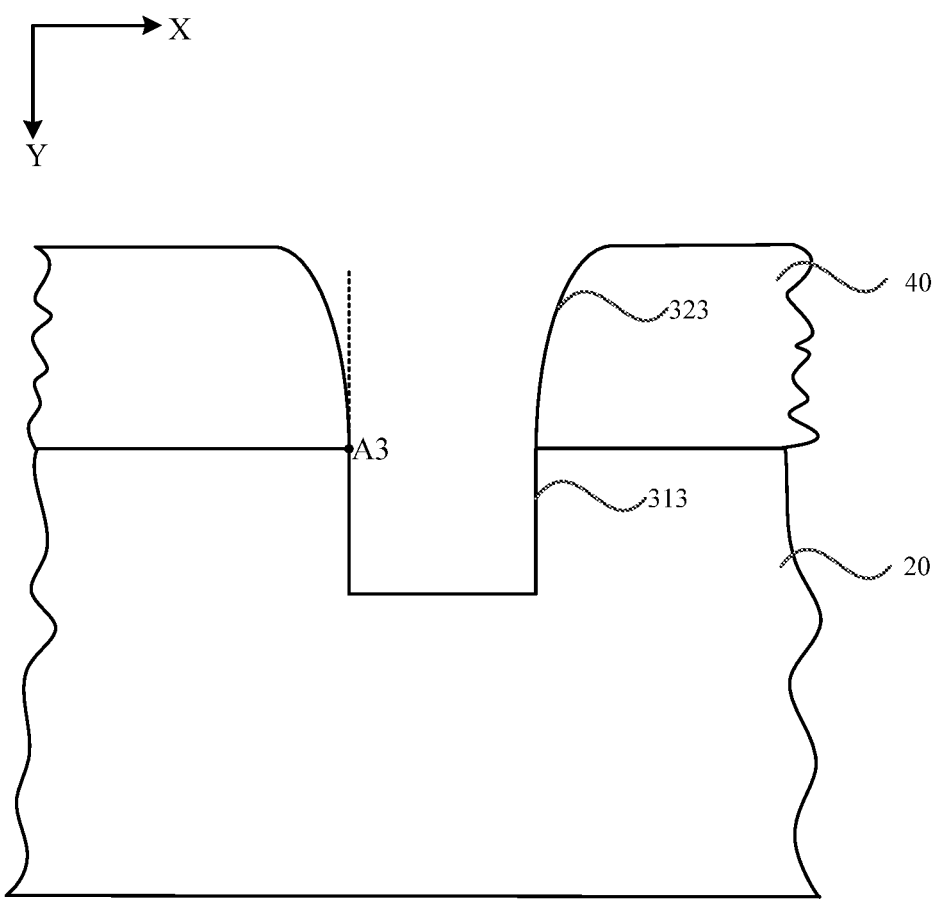
FIG. 5 is a schematic enlarged diagram of a gate trench according to yet another embodiment of this application.

FIG. 5 is a schematic enlarged diagram of a gate trench according to yet another embodiment of this application. As shown in FIG. 5, the tangent line of the first sidewall 323 at the joining position of the first sidewall 323 and the second sidewall 313 coincides with the second sidewall 313.

Exemplarily, since the vertical projection of the second opening 321 on the substrate 10 coincides with the vertical projection of the first opening 312 on the substrate 10, it is ensured that the opening area of the second opening 321 and the opening area of the first opening 312 are the same, thereby ensuring the first sub-portion 31 of the gate trench 30 and the second sub-portion 32 of the gate trench 30 completely fit each other. Further, the tangent line of the first sidewall 323 at the joining position A3 of the first sidewall 323 and the second sidewall 313 is set to coincide with the second sidewall 313 to ensure that the first sidewall 323 and the second sidewall 313 are transitioned smoothly at the joining position A3 without bumps or pits, so that there is no change accumulation at the joining position of the first sidewall 323 and the second sidewall 313 during operation of the semiconductor device, which can improve the short channel effect of the device and the reliability of the structure of the gate itself.

Optionally, with continued reference to FIG. 1, the multilayer semiconductor layer 20 according to the embodiments of this application may include: a nucleation layer 201 on the substrate 10; a buffer layer 202 on the side of the nucleation layer 201 away from the substrate 10; a channel layer 203 on the side of the buffer layer 202 away from the nucleation layer 201; and a barrier layer 204 on the side of the channel layer 203 away from the buffer layer 202.

Exemplarily, the material of the nucleation layer 201 and the buffer layer 202 may be nitride, specifically GaN or AlN or other nitrides, or silicon or other semiconductor materials. The nucleation layer 201 and the buffer layer 202 may be used to match the material of the substrate 10 and the epitaxial channel layer 203. The material of the channel layer 203 may be GaN or InAlN, or silicon or other semiconductor materials. The barrier layer 204 is located above the channel layer 203, and the material of the barrier layer 204 may include a gallium-based compound semiconductor material or a nitrogen-based compound semiconductor material, such as $In_xAl_yGa_zN_{1-xyz}$, where $0 \leq x \leq 1$, $0 \leq y \leq 1$, $0 \leq z \leq 1$. Optionally, the channel layer 203 and the barrier layer 204 form a semiconductor heterojunction structure, and a high-concentration two-dimensional electron gas is formed at the interface of the channel layer 203 and the barrier layer 204. Optionally, the material of the barrier layer 204 may also be silicon or other semiconductor materials. Therefore, the multilayer semiconductor layer 20 according to the embodiments of this application may be a III-V compound semiconductor material, or may be silicon or other semiconductor materials, which is not limited in the embodiments of this application.

It should be understood that in the embodiments of this application, the reliability of the semiconductor device is improved from the perspective of the design of the gate trench structure of the semiconductor device. The semiconductor device may be, but is not limited to, a high-power gallium nitride High Electron Mobility Transistor (HEMT) that works in a high-voltage and high-current environment, and a Silicon-On-Insulator (SOI) transistor, a GaAs-based transistor, a Metal-Oxide-Semiconductor Field-Effect Transistor (MOSFET), a Metal-Insulator-Semiconductor Field-Effect Transistor (MISFET), a Double Heterojunction Field-Effect Transistor (DHFET), a Junction Field-Effect Transistor (JFET), a Metal-Semiconductor Field-Effect Transistor (MESFET), a Metal-Insulator-Semiconductor Heterojunction Field-Effect Transistor (MISHFET) or another field effect transistor.

The embodiments of this application also provide an electronic device, including the semiconductor device described in the above-mentioned embodiments in FIG. 1 to FIG. 5. The electronic device may be any apparatus that uses the aforementioned semiconductor device, such as, a mobile phone, a computer, a tablet, etc.

Figure 6:
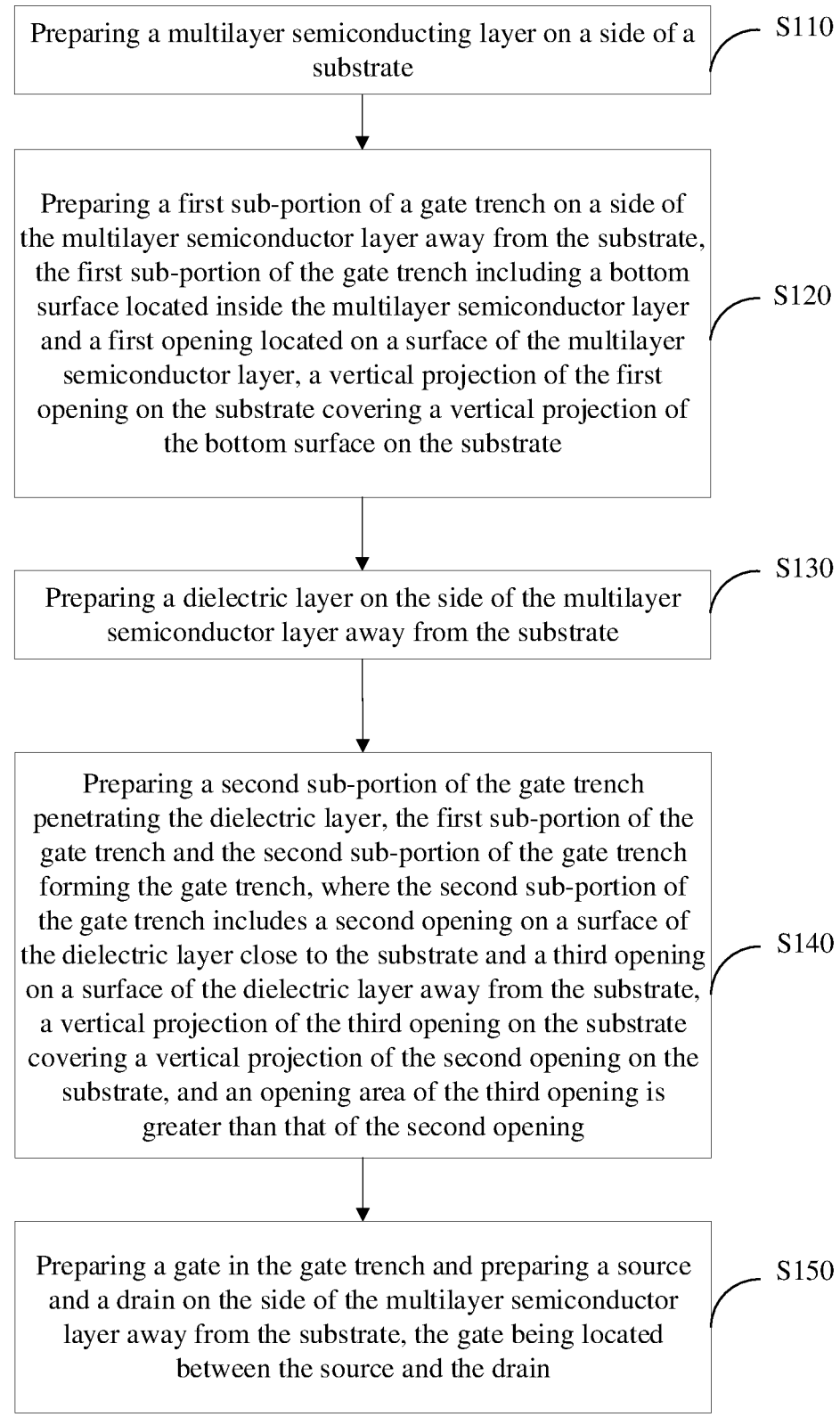
FIG. 6 is a schematic flowchart of a preparation method for a semiconductor device according to an embodiment of this application.

Based on the same inventive concept, the embodiments of this application also provide a preparation method for a semiconductor device. As shown in FIG. 6, the preparation method for the semiconductor device according to an embodiment of this application may include:

S110: preparing a multilayer semiconducting layer on a side of a substrate.

Exemplarily, the material of the substrate may be Si, SiC or sapphire, or other materials suitable for growing semiconductor materials. The preparation method of the substrate can be an atmospheric chemical vapor deposition method, a sub-atmospheric chemical vapor deposition method, a metal organic compound vapor deposition method, a low pressure chemical vapor deposition method, a high density plasma chemical vapor deposition method, an ultra-high vacuum chemical vapor deposition method, a plasma enhanced chemical vapor deposition method, a catalyst chemical vapor deposition method, a hybrid physical chemical vapor deposition method, a rapid thermal chemical vapor deposition method, a vapor phase epitaxy method, a pulsed laser deposition method, an atomic layer epitaxy method, a molecular beam epitaxy method, a sputtering Shooting method or an evaporation method.

Exemplarily, the multi-layer semiconductor layer is located on one side of the substrate, and the multi-layer semiconductor layer may specifically be a III-V compound semiconductor material, or may be silicon or other semiconductor materials, which is not limited in the embodiments of this application.

S120: preparing a first sub-portion of a gate trench on a side of the multilayer semiconductor layer away from the substrate, the first sub-portion of the gate trench including a bottom surface located inside the multilayer semiconductor layer and a first opening located on a surface of the multilayer semiconductor layer, a vertical projection of the first opening on the substrate covering a vertical projection of the bottom surface on the substrate.

Exemplarily, an etching method is used to form a first sub-portion of the gate trench in a designated gate area on the side of the multilayer semiconductor layer away from the substrate, and the first sub-portion of the gate trench includes the bottom surface located inside the multilayer semiconductor layer and the first opening located on the surface of the multilayer semiconductor layer.

Specifically, the extension length of the bottom surface in the horizontal direction is less than or equal to 0.25 μm, which is beneficial to realize the high frequency characteristics of the semiconductor device. Further, the distance between the bottom surface and the surface of the two-dimensional electron gas in the multilayer semiconductor layer is greater than or equal to 15 nm to ensure that there is sufficient two-dimensional electron gas under the gate trench when the channel of the semiconductor device is turned on, thereby ensuring the low on-resistance characteristics of the semiconductor device.

The vertical projection of the first opening on the substrate covers the vertical projection of the bottom surface on the substrate. The opening area of the first opening may be equal to the coverage area of the bottom surface, or the opening area of the first opening may be greater than the coverage area of the bottom surface, which is not limited in the embodiments of the application.

S130: preparing a dielectric layer on the side of the multilayer semiconductor layer away from the substrate.

Specifically, since the first sub-portion of the gate trench is formed in the multilayer semiconductor layer, the dielectric layer is prepared on the side of the multilayer semiconductor layer away from the substrate, that is, the dielectric layer is prepared on the surface of the multilayer semiconductor layer away from the substrate and in the first sub-portion of the gate trench. The dielectric layer covers the surface of the multilayer semiconductor layer away from the substrate and the bottom surface of the first sub-portion of the gate trench located in the multilayer semiconductor layer.

S140: preparing a second sub-portion of the gate trench penetrating the dielectric layer, the first sub-portion of the gate trench and the second sub-portion of the gate trench forming the gate trench, where the second sub-portion of the gate trench includes a second opening on a surface of the dielectric layer close to the substrate and a third opening on a surface of the dielectric layer away from the substrate, a vertical projection of the third opening on the substrate covering a vertical projection of the second opening on the substrate, and an opening area of the third opening is greater than that of the second opening.

Exemplarily, the vertical projection of the first opening on the substrate covers the vertical projection of the bottom surface on the substrate, the vertical projection of the third opening on the substrate covers the vertical projection of the second opening on the substrate, and the opening area of the third opening is greater than that of the second opening, so that it is ensured that the gate trench has a smaller size on the side close to the substrate, and the gate formed in the gate trench has a smaller size on the side close to the substrate, which is beneficial to achieve high-frequency characteristics of the semiconductor device. In addition, the side of the gate trench away from the substrate has a larger size, so the gate formed in the gate trench has a larger size on the side away from the substrate, which is beneficial to reduce the resistance of the gate, and at the same time enhance the control ability of the gate of the semiconductor device to the channel region, which is beneficial to suppress the short channel effect of the semiconductor device and improve the reliability of the device. Further, the side of the gate trench away from the substrate has a larger size, which can prevent the gate metal strip from being deformed during stripping the gate metal on the surface of the dielectric layer and improve the small-size gate preparation process.

S150: preparing a gate in the gate trench and preparing a source and a drain on the side of the multilayer semiconductor layer away from the substrate, the gate being located between the source and the drain.

Exemplarily, the source and the drain form an ohmic contact with the multilayer semiconductor layer, and the gate forms a Schottky contact with the multilayer semiconductor layer. Optionally, the material of the source and drain may be one or a combination of metals such as Ni, Ti, Al and Au, and the material of the gate may be one or a combination of metals such as Ni, Pt, Pb and Au.

In the semiconductor device according to the embodiments of this application, the first sub-portion of the gate trench is provided in the multilayer semiconductor layer and the second sub-portion of the gate trench is provided in the dielectric layer, the vertical projection of the first opening of the first sub-portion of the gate trench on the substrate covers the vertical projection of the bottom surface of the first sub-portion of the gate trench on the substrate, the vertical projection of the third opening of the second sub-portion of the gate trench on the substrate covers the vertical projection of the second opening of the second sub-portion of the gate trench on the substrate, and the opening area of the third opening is greater than that of the second opening. In this way, on one hand, it can ensure that the gate trench has a smaller size on the side close to the substrate, which is beneficial to realize the high-frequency characteristics of the semiconductor device; on the other hand, it can ensure that the gate trench has a relatively larger size on the side far from the substrate, which is beneficial to reduce the gate resistance and enhance the control ability of the gate of the semiconductor device to the channel region, so that the short channel effect of the semiconductor device can be suppressed and the reliability of the device can be improved. In another aspect, due to the opening area of the third opening being greater than that of the second opening, the deformation of the gate metal strip can be prevented when the gate metal on the surface of the dielectric layer is stripped, thereby improving the accuracy of preparation process for the small-sized gate.

According to an embodiment of this application, the vertical projection of the second opening on the substrate coincides with the vertical projection of the first opening on the substrate, so as to ensure that the first sub-portion of the gate trench completely fits the second sub-portion of the gate trench, which prevents the gate from being deformed during the gate metal stripping procedure and improves the stability and reliability of the semiconductor device.

According to an embodiment of this application, preparing a first sub-portion of a gate trench on a side of the multilayer semiconductor layer away from the substrate (S120) may include: preparing the first sub-portion of the gate trench at a designated position on the side of the multi-layer semiconductor layer away from the substrate using a first mask process.

According to an embodiment of this application, preparing a dielectric layer on the side of the multilayer semiconductor layer away from the substrate (S130) may include: preparing the dielectric layer on the surface of the multilayer semiconductor layer away from the substrate and in the first sub-portion of the gate trench.

Further, preparing a second sub-portion of the gate trench penetrating the dielectric layer (S140) may include: removing a part of the dielectric layer above the first sub-portion of the gate trench and a part of the dielectric layer inside the first sub-portion of the gate trench using a second mask process; using a third mask process, removing a part of the dielectric layer surrounding the first sub-portion of the gate trench using a gradual process of gradually decreasing an etch rate aspect ratio of the dielectric layer, to obtain the second sub-portion of the gate trench.

The second sub-portion of the gate trench includes a second opening located on the surface of the dielectric layer close to the substrate and a third opening on the surface of the dielectric layer away from the substrate. The vertical projection of the second opening on the substrate coincides with the vertical projection of the first opening on the substrate, the vertical projection of the third opening on the substrate covers the vertical projection of the second opening on the substrate, and the opening area of the third opening is greater than that of the second opening.

Exemplarily, the process for preparing the gate trench will be described in detail below.

Using the first mask process, the first sub-portion of the gate trench is prepared by etching at the designated position on the side of the multi-layer semiconductor layer away from the substrate; the dielectric layer is prepared on the surface of the multi-layer semiconductor layer away from the substrate and in the first sub-portion of the gate trench; a part of the dielectric layer located above the first sub-portion of the gate trench and a part of the dielectric layer inside the first sub-portion of the gate trench are sequentially etched and removed using the second mask process; using the third mask process, a part of the dielectric layer surrounding the first sub-portion of the gate trench is removed using the gradual process of gradually decreasing the etch rate aspect ratio of the dielectric layer, to obtain the second sub-portion of the gate trench.

In the process of preparing the gate trench, it is ensured that the second sub-portion of the gate trench has a small opening area on the side close to the substrate and a large opening area on the side far from the substrate. During the etching procedure, the etch rate aspect ratio of the dielectric layer can be understood as a ratio of the horizontal etching rate to the vertical etching rate.

In an embodiment, the gradual process of gradually decreasing the etch rate aspect ratio of the dielectric layer means that the etch rate aspect ratio is continuously reduced in the depth direction of the etching, so as to form the required second sub-portion of the gate trench.

Description on the specific structure of the semiconductor device prepared by the preparation method for the semiconductor device according to the embodiments of this application can be referred to the description of the semiconductor device in the above-mentioned embodiments of FIG. 1 to FIG. 5, and will not be repeated here to avoid redundancy.

It should be noted that the above are only the preferred embodiments of this application and the applied technical principles. Those skilled in the art will understand that this application is not limited to the specific embodiments described herein, and various obvious changes, readjustments, mutual combinations and substitutions can be made to those skilled in the art without departing from the protection scope of this application. Therefore, although this application has been described in more detail through the above embodiments, this application is not limited to the above embodiments, and can also include more other equivalent embodiments without departing from the concept of this application. The scope of protection of the present application is determined by the scope of the appended claims.

What is claimed is:

1. A semiconductor device, comprising:
a substrate;
a multi-layer semiconductor layer located on a side of the substrate, a first sub-portion of a gate trench being formed on a side of the multi-layer semiconductor layer away from the substrate, the first sub-portion of the gate trench comprising a bottom surface located inside the multilayer semiconductor layer and a first opening located on a surface of the multiconductor layer, and a vertical projection of the first opening on the substrate covering a vertical projection of the bottom surface on the substrate;
a dielectric layer located on the side of the multi-layer semiconductor layer away from the substrate, a second sub-portion of the gate trench penetrating the dielectric layer being formed in the dielectric layer, and the first sub-portion of the gate trench and the second sub-portion of the gate trench forming the gate trench; the second sub-portion of the gate trench comprising a second opening located on a surface of the dielectric layer close to the substrate and a third opening located on a surface of the dielectric layer away from the substrate, a vertical projection of the third opening on the substrate covering a vertical projection of the second opening on the substrate, and an opening area of the third opening is greater than an opening area of the second opening;
a gate located in the gate trench, and a source and a drain located on the side of the multilayer semiconductor layer away from the substrate, the gate being located between the source and the drain, wherein
the vertical projection of the second opening on the substrate coincides with the vertical projection of the first opening on the substrate, the second sub-portion of the gate trench further comprises a first sidewall connecting the second opening and the third opening, the first sub-portion of the gate trench further comprises a second sidewall connecting the bottom surface and the first opening; and
a cross-sectional shape of the first sidewall in a direction perpendicular to a plane where the second opening is located is a curve or a straight line, and a tangent line at any point on the curve is located on a side where the first sidewall faces a center of the second sub-portion of the gate trench,
wherein the gate is in direct contact with the first sidewall of the gate trench, the first sidewall is a sidewall, located in the gate trench, of the dielectric layer, and the second sub-portion of the gate trench penetrating the dielectric layer is formed in the dielectric layer based on the first opening.

2. The semiconductor device according to claim 1, wherein an extension length of the bottom surface along a direction from the source to the drain is denoted as L3, L3≤0.25 µm.

3. The semiconductor device according to claim 1, wherein a vertical projection length of the first sidewall on the substrate along a direction from the source to the drain is denoted as L1, and an extension length of the first sidewall along a direction perpendicular to the substrate is denoted as L2, L1<L2.

4. The semiconductor device according to claim 1, wherein an extension length of the first sidewall along a direction perpendicular to the substrate is denoted as L2, and an extension length of the second sidewall along the direction perpendicular to the substrate is denoted as L4, L4≤L2.

5. The semiconductor device according to claim 1, wherein an extension length of the second sidewall along a direction perpendicular to the substrate is denoted as L4, L4≤15 nm.

6. The semiconductor device according to claim 1, wherein a vertical projection length of the first sidewall on the substrate along a direction from the source to the drain is denoted as L1, a vertical projection length of the second sidewall on the substrate along the direction from the source to the drain is denoted as L5, an extension length of the first sidewall along a direction perpendicular to the substrate is denoted as L2, and an extension length of the second sidewall along the direction perpendicular to the substrate is denoted as L4, L2/L1≤L4/L5.

7. The semiconductor device according to claim 1, wherein the cross-sectional shape of the second sidewall in the direction perpendicular to the plane where the first opening is located is a straight line, a tangent line of the first sidewall at a joining position of the first sidewall and the second sidewall coincides with the second sidewall.

8. The semiconductor device according to claim 1, wherein a cross-sectional shape of the second sidewall in the direction perpendicular to the plane where the first opening is located is a curve, the tangent line of the first sidewall at the joining position of the first sidewall and the second sidewall coincides with a tangent line of the second sidewall at the joining position of the first sidewall and the second sidewall.

9. The semiconductor device according to claim 1, wherein an extension length of the bottom surface along a direction from the source to the drain is denoted as L3, and a size of the first opening along the direction from the source to the drain is denoted as L6, L3≤L6≤0.4 μm.

10. The semiconductor device according to claim 1, wherein a two-dimensional electron gas is formed in the multilayer semiconductor layer; and
a distance between the bottom surface and a surface of the two-dimensional electron gas along a direction perpendicular to the substrate is denoted as h, h≥15 nm.

11. The semiconductor device according to claim 1, wherein a surface of the gate away from the substrate fits an edge of the third opening of the second sub-portion of the gate trench.

12. The semiconductor device according to claim 1, wherein the first opening and the second opening are obtained by preparing the first sub-portion of the gate trench on the side of the multilayer semiconductor layer away from the substrate, preparing the dielectric layer on the side of the multi-layer semiconductor layer away from the substrate, and preparing the second sub-portion of the gate trench penetrating the dielectric layer.

13. A preparation method for a semiconductor device, comprising:
preparing a multilayer semiconducting layer on a side of a substrate;
preparing a first sub-portion of a gate trench on a side of the multilayer semiconductor layer away from the substrate, the first sub-portion of the gate trench comprising a bottom surface located inside the multilayer semiconductor layer and a first opening located on a surface of the multilayer semiconductor layer, a vertical projection of the first opening on the substrate covering a vertical projection of the bottom surface on the substrate;
preparing a dielectric layer on the side of the multi-layer semiconductor layer away from the substrate;
preparing a second sub-portion of the gate trench penetrating the dielectric layer, the first sub-portion of the gate trench and the second sub-portion of the gate trench forming the gate trench, the second sub-portion of the gate trench comprising a second opening located on a surface of the dielectric layer close to the substrate and a third opening located on a surface of the dielectric layer away from the substrate, a vertical projection of the third opening on the substrate covering a vertical projection of the second opening on the substrate, and an opening area of the third opening is greater than an opening area of the second opening; and
preparing a gate in the gate trench and a source and a drain on the side of the multilayer semiconductor layer away from the substrate, and the gate being located between the source and the drain, wherein
the vertical projection of the second opening on the substrate coincides with the vertical projection of the first opening on the substrate, the second sub-portion of the gate trench further comprises a first sidewall connecting the second opening and the third opening, the first sub-portion of the gate trench further comprises a second sidewall connecting the bottom surface and the first opening; and
a cross-sectional shape of the first sidewall in a direction perpendicular to a plane where the second opening is located is a curve or a straight line, and a tangent line at any point on the curve is located on a side where the first sidewall faces a center of the second sub-portion of the gate trench.

14. The preparation method according to claim 13, wherein an extension length of the bottom surface along a direction from the source to the drain is denoted as L3, L3≤0.25 μm.

15. The preparation method according to claim 13, wherein a vertical projection length of the first sidewall on the substrate along a direction from the source to the drain is denoted as L1, and an extension length of the first sidewall along a direction perpendicular to the substrate is denoted as L2, L1<L2.

16. The preparation method according to claim 13, wherein an extension length of the first sidewall along a direction perpendicular to the substrate is denoted as L2, and an extension length of the second sidewall along the direction perpendicular to the substrate is denoted as L4, L4≤L2.

17. The preparation method according to claim 13, wherein an extension length of the second sidewall along a direction perpendicular to the substrate is denoted as L4, L4≤15 nm.

18. The preparation method according to claim 13, wherein the preparing the first sub-portion of the gate trench on the side of the multilayer semiconductor layer away from the substrate comprises:
preparing the first sub-portion of the gate trench at a designated position on the side of the multi-layer semiconductor layer away from the substrate using a first mask process.

19. The preparation method according to claim 13, wherein the preparing the dielectric layer on the side of the multilayer semiconductor layer away from the substrate comprises:
preparing the dielectric layer on the surface of the multilayer semiconductor layer away from the substrate and in the first sub-portion of the gate trench, and
wherein the preparing the second sub-portion of the gate trench penetrating the dielectric layer comprises:
removing a part of the dielectric layer above the first sub-portion of the gate trench and a part of the dielectric layer inside the first sub-portion of the gate trench using a second mask process; and
removing a part of the dielectric layer surrounding the first sub-portion of the gate trench using a gradual process of gradually decreasing an etch rate aspect ratio of the dielectric layer by using a third mask process, so as to obtain the second sub-portion of the gate trench.

20. The preparation method according to claim 13, wherein a cross-sectional shape of the second sidewall in the direction perpendicular to the plane where the first opening is located is a curve, the tangent line of the first sidewall at the joining position of the first sidewall and the second sidewall coincides with a tangent line of the second sidewall at the joining position of the first sidewall and the second sidewall.

* * * * *